United States Patent
Hsu et al.

(10) Patent No.: US 8,813,016 B1
(45) Date of Patent: Aug. 19, 2014

(54) MULTIPLE VIA CONNECTIONS USING CONNECTIVITY RINGS

(71) Applicant: Taiwan Semiconductor Manufacturing Company Limited, Hsin-Chu (TW)

(72) Inventors: Chin-Hsiung Hsu, Guanyin Township (TW); Huang-Yu Chen, Zhudong Township (TW); Li-Chun Tien, Tainan (TW); Lee-Chung Lu, Taipei (TW); Hui-Zhong Zhuang, Kaohsiung (TW); Cheng-I Huang, Hsinchu (TW); Chung-Hsing Wang, Baoshan Township (TW); Yi-Kan Cheng, Taiepi (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 13/751,264

(22) Filed: Jan. 28, 2013

(51) Int. Cl.
*G06F 17/50* (2006.01)
(52) U.S. Cl.
USPC ............ 716/127; 716/120; 716/126; 716/133
(58) Field of Classification Search
USPC .................................. 716/120, 126–127, 133
See application file for complete search history.

(56) References Cited

U.S. PATENT DOCUMENTS

| | | | |
|---|---|---|---|
| 5,610,831 A | | 3/1997 | Matsumoto |
| 6,373,717 B1 * | | 4/2002 | Downes et al. ............... 361/795 |
| 6,778,406 B2 * | | 8/2004 | Eldridge et al. ............... 361/776 |
| 6,894,326 B2 * | | 5/2005 | Nowak ........................... 257/213 |
| 7,117,469 B1 * | | 10/2006 | Dahl ............................... 716/122 |
| 7,124,390 B2 * | | 10/2006 | Smith et al. .................... 716/120 |
| 7,979,983 B2 * | | 7/2011 | Bird et al. ........................ 29/852 |
| 8,084,310 B2 * | | 12/2011 | Mebarki et al. ............... 438/164 |

(Continued)

FOREIGN PATENT DOCUMENTS

| JP | 5230251 B2 | 7/2013 |
|---|---|---|
| KR | 100190182 B1 | 6/1999 |
| KR | 1020090012136 A | 2/2009 |
| KR | 101281440 B1 | 7/2013 |

OTHER PUBLICATIONS

Gao, et al., "Flexible Self-aligned Double Patterning Aware Detailed Routing with Prescribed Layout Planning", 2012, http://archive.sigda.org/ispd/ISPD12Slides/ISPD12_1_4.pdf, pp. 1-38.
Notice of Allowance dated May 20, 2014.

*Primary Examiner* — Naum Levin
(74) *Attorney, Agent, or Firm* — Cooper Legal Group LLC

(57) ABSTRACT

Among other things, one or more techniques and/or systems for performing design layout are provided. In an example, a design layout corresponds to a layout of a standard cell whose connectivity is described by a netlist. For example, the netlist specifies net types for respective vias of the standard cell. One or more connectivity rings are formed within the design layout to provide connectivity for one or more vias of the design layout. For example, a first connectivity ring is generated, such as from mandrel, to connect one or more ring one vias. A second connectivity ring is generated, such as from passive pattern, to connect one or more ring two vias. One or more cuts are generated within the design layout to isolate vias having different net types. In this way, the design layout is self-aligned double patterning (SADP) compliant.

20 Claims, 15 Drawing Sheets

(56) References Cited

U.S. PATENT DOCUMENTS

| | | | |
|---|---|---|---|
| 8,312,394 B2* | 11/2012 | Ban et al. | 716/50 |
| 2005/0050505 A1* | 3/2005 | Bednar et al. | 716/12 |
| 2010/0090722 A1* | 4/2010 | Kao | 326/103 |
| 2011/0014786 A1* | 1/2011 | Sezginer et al. | 438/618 |
| 2011/0031536 A1 | 2/2011 | Okamoto et al. | |
| 2011/0113398 A1* | 5/2011 | Keinert et al. | 716/127 |
| 2012/0221988 A1* | 8/2012 | Dai et al. | 716/111 |
| 2013/0174103 A1* | 7/2013 | Shieh et al. | 716/54 |

* cited by examiner

MULTIPLE VIA CONNECTIONS USING CONNECTIVITY RINGS

BACKGROUND

Electronic design tools allow designers to layout, simulate, and analyze electronic components, such as standard cells and integrated circuits. In an example, a designer may create a design layout for a standard cell. Once the design layout, without considering self-aligned double patterning (SADP), is complete, complex post processing is used to make the design layout SADP compliant. For example, the design layout is adjusted using mandrel pattern and one or more cuts utilized to define passive pattern. Adding mandrel, such as assist mandrel, for SADP compliance can lead to area penalty of the standard cell and design flexibility degradation.

SUMMARY

This summary is provided to introduce a selection of concepts in a simplified form that are further described below in the detailed description. This summary is not intended to identify key factors or essential features of the claimed subject matter, nor is it intended to be used to limit the scope of the claimed subject matter.

One or more techniques and systems for performing design layout are provided herein. In some embodiments, the design layout corresponds to a standard cell. The standard cell is configured to provide functionality, such as logic-based functionality or storage functionality. For example, the standard cell comprises one or more transistors and one or more interconnect structures, such as vias. A netlist for the design layout describes connectivity of the standard cell. For example, the netlist specifies net types for respective vias within the design layout. A net type identifies a via as belonging to a particular net. The netlist can be used to perform design layout of the standard cell, such that the design layout is self-aligned double patterning (SADP) layout compliant, as provided herein.

Accordingly, a first connectivity ring is generated within the design layout. The first connectivity ring is generated from a first connectivity material type, such as mandrel or passive pattern. The first connectivity ring provides connectivity for one or more ring one vias. For example, a ring one via is a via that is connected by the first connectivity ring. In an example, responsive to the first connectivity ring connecting a first ring one via to a second ring one via, where the first ring one via has a net type that is different than a net type of the second ring one via, a first cut is applied to the first connectivity ring to isolate the first ring one via from the second ring one via. In this way, one or more cuts are performed on the first connectivity ring so that ring one vias of different net types are isolated from one another.

A second connectivity ring is generated within the design layout. The second connectivity ring is generated from a second connectivity material type that is different than the first connectivity material type. In an example, the first connectivity material type corresponds to mandrel, while the second connectivity material type corresponds to passive pattern or a material type that is different than mandrel. In an example, the first connectivity material type corresponds to passive pattern, while the first connectivity material type corresponds to mandrel or a material type that is different than passive pattern. The second connectivity ring provides connectivity for one or more ring two vias. For example, a ring two via is a via that is connected by the second connectivity ring. In an example, responsive to the second connectivity ring connecting a first ring two via to a second ring two via, where the first ring two via has a net type that is different than a net type of the second ring two via, a second cut is applied to the second connectivity ring to isolate the first ring two via from the second ring two via. In this way, one or more cuts are performed on the second connectivity ring so that ring two vias of different net types are isolated from one another. In some embodiments, one or more additional connectivity rings are generated and cut to isolate vias of different net types.

Connecting one or more vias using connectivity rings provides improved direct control over electrical characteristics of devices represented within the design layout. In an example, the developer has improved control on self-aligned double patterning (SADP) lithography variations, such as swap cuts or cross-circle connectors, and electrical characteristics of the devices. For example, relatively wide metal portions within the design layout can be reduced by using at least one of a swap cut or a cross-circle connector.

The following description and annexed drawings set forth certain illustrative aspects and implementations. These are indicative of but a few of the various ways in which one or more aspects can be employed. Other aspects, advantages, and novel features of the disclosure will become apparent from the following detailed description when considered in conjunction with the annexed drawings.

DETAILED DESCRIPTION

Figure 1:
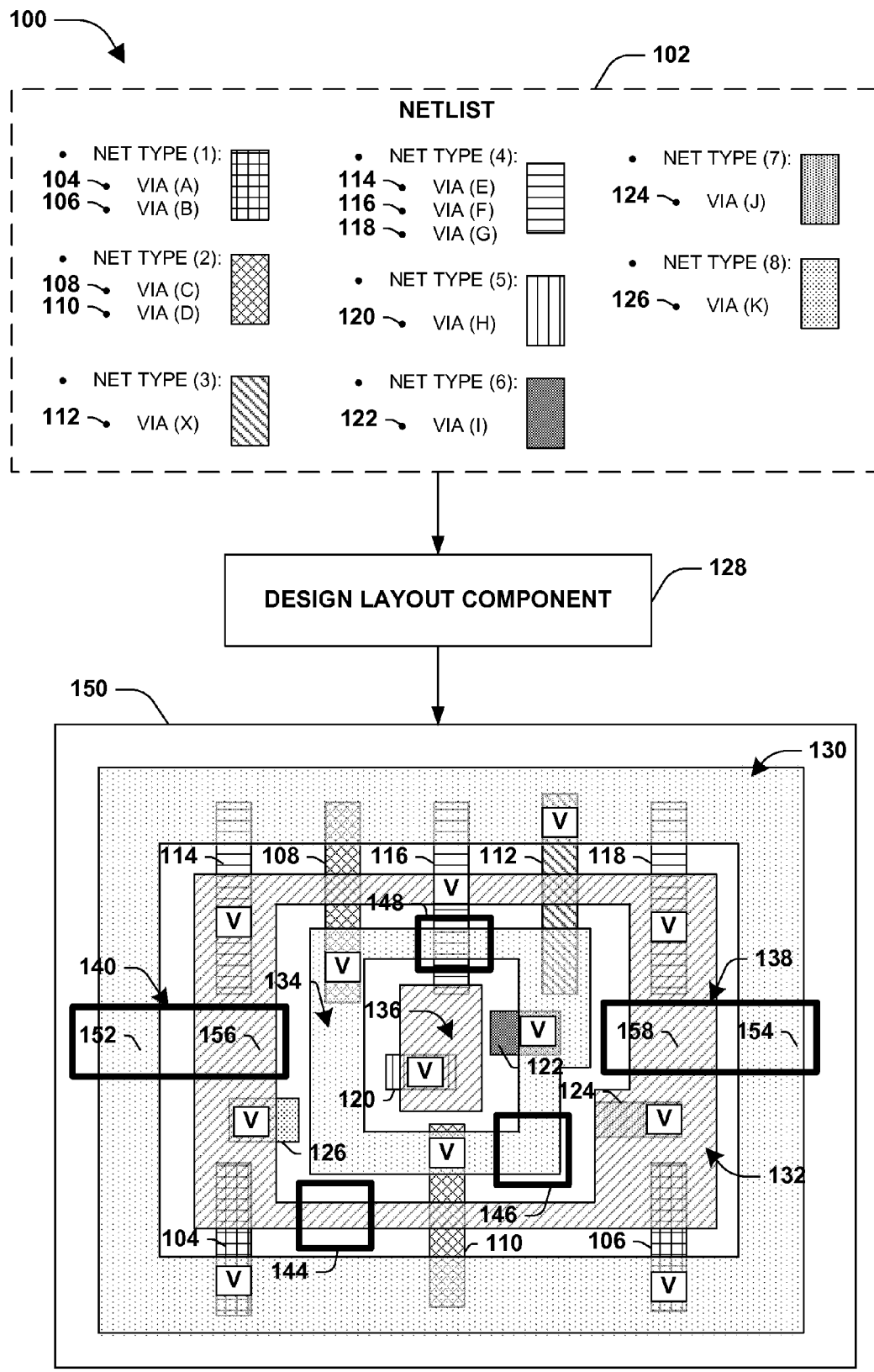
FIG. 1 is a component block diagram illustrating an exemplary system for performing design layout, according to some embodiments.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter.

FIG. 1 illustrates an example, according to some embodiments, of a system 100 for performing design layout. The system 100 comprises a design layout component 128. The design layout component 128 is configured to receive a netlist 102 describing connectivity of a standard cell that is to be laid out within a design layout 150. For example, the netlist 102 specifies that a via (A) 104 and a via (B) 106 belong to a first net type, such that the via (A) 104 and the via (B) 106 are allowed to be connected together, but not connected to vias of other net types. The netlist 102 specifies that a via (C) 108 and a via (D) 110 belong to a second net type, such that the via (C) 108 and the via (B) 110 are allowed to be connected together, but not connected to vias of other net types. The netlist 102 specifies that a via (X) 112 belongs to a third net type, such that the via (X) 112 is not to be connected to vias of other net types. The netlist 102 specifies that a via (E) 114, a via (F) 116, and a via (G) 118 belong to a fourth net type, such that via (E) 114, via (F) 116, and via (G) 118 are allowed to be connected together, but not connected to vias of other net types.

The netlist 102 specifies that a via (H) 120 belongs to a fifth net type, such that the via (H) 120 is not to be connected to vias of other net types. The netlist 102 specifies that a via (I) 122 belongs to a sixth net type, such that the via (I) 122 is not to be connected to vias of other net types. The netlist 102 specifies that a via (J) 124 belongs to a seventh net type, such that the via (J) 124 is not to be connected to vias of other net types. The netlist 102 specifies that a via (K) 126 belongs to an eighth net type, such that the via (K) 126 is not to be connected to vias of other net types.

The design layout component 128 is configured to generate the design layout 150 based upon the netlist 102, such that the design layout 150 is at least one of self-aligned double patterning (SADP) compliant or self-aligned multiple patterning (SAMP) compliant. In an example, the design layout 150 comprises a first connectivity ring 130 comprising a first connectivity material type, such as mandrel. The first connectivity ring 130 provides connectivity to the via (A) 104, the via (B) 106, and the via (X) 112. Because the via (A) 104 and the via (B) 106 belong to the first net type, while the via (X) 112 belongs to the third net type, a first cut 152 and a second cut 154 are generated to isolate via (X) 112 from the via (A) 104 and the via (B) 106.

The design layout comprises a second connectivity ring 132 comprising a second connectivity material type, such as a passive pattern. The second connectivity ring 132 provides connectivity to the via (E) 114, the via (F) 116, the via (G) 118, the via (J) 124, and the via (K) 126. Because the via (E) 114, the via (F) 116, and the via (G) 118 belong to the fourth net type, a third cut 156 and a fourth cut 158 are generated to isolate the via (E) 114, the via (F) 116, and the via (G) 118 from vias belonging to other net types, such as the via (J) 124 and the via (K) 126. In an example, the first cut 152 and the third cut 156 are merged to create a first merged cut 140, and the second cut 154 and the fourth cut 158 are merged to create a second merged cut 138. A fifth cut 144 is generated to isolate the via (J) 124 and the via (K) 126 from one another because the via (J) 124 has a seventh net type, while the via (K) 126 has an eighth net type.

The design layout 150 comprises a third connectivity ring 134 comprising the first connectivity material type, such as mandrel. The third connectivity ring 134 provides connectivity to the via (C) 108, the via (D) 110, and the via (I) 122. Because the via (C) 108 and the via (D) 110 belong to the second net type, while the via (I) 122 belongs to the sixth net type, a sixth cut 146 and a seventh cut 148 are generated to isolate via (I) 122 from the via (C) 108 and the via (D) 110. The design layout 150 comprises a fourth connectivity ring 136. The fourth connectivity ring 136 provides connectivity to the via (H) 120. In this way, the design layout 150 comprises one or more connectivity rings (e.g., formed according to an onion-based design) that provides connectivity for vias without connecting vias of differing net types together for SADP compliance. It is appreciated that some embodiments of generating the design layout 150 are described in further detail with regard to FIGS. 2-13.

Figure 2:
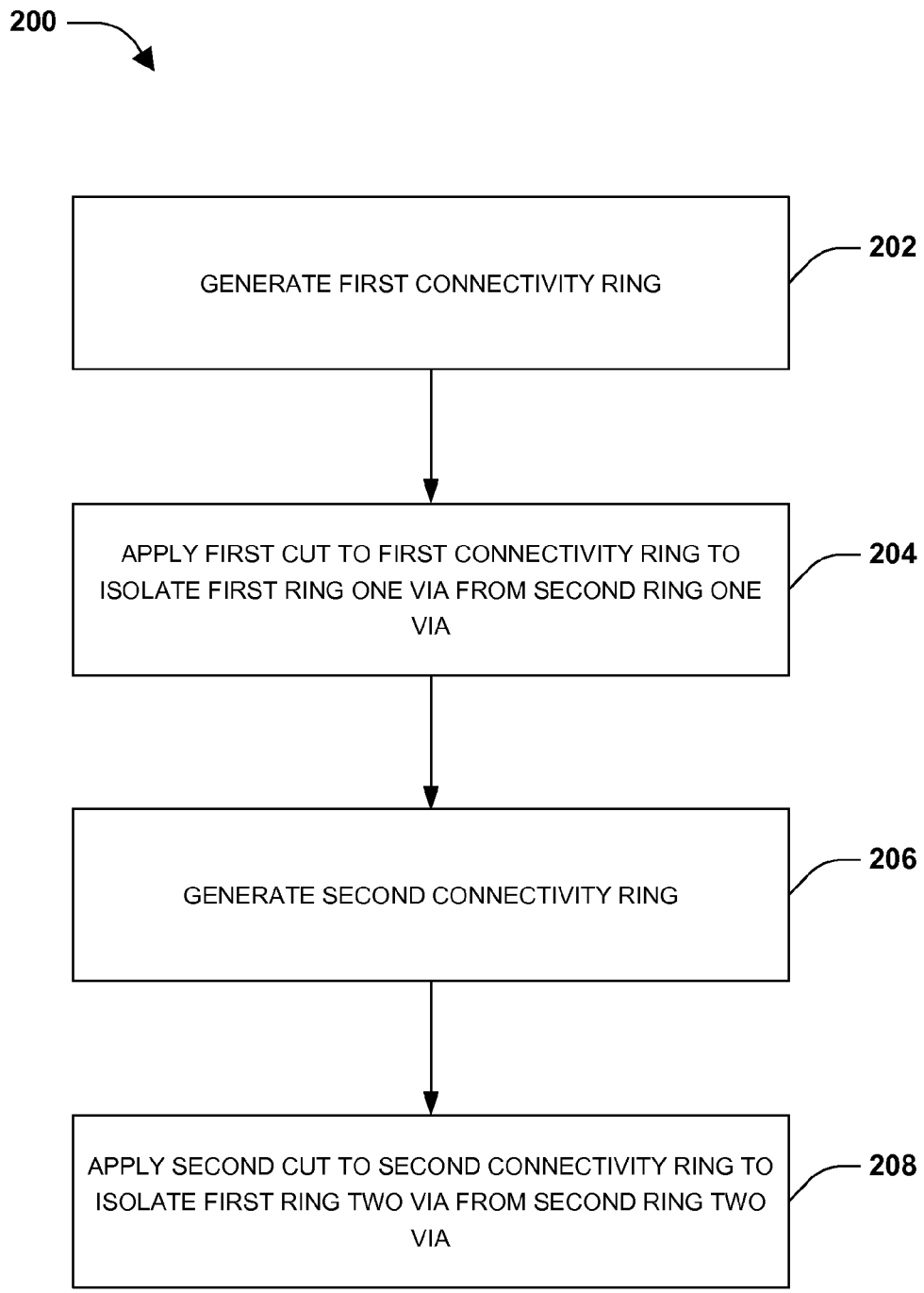
FIG. 2 is a flow diagram illustrating an example method of performing design layout, according to some embodiments.
Figure 3:
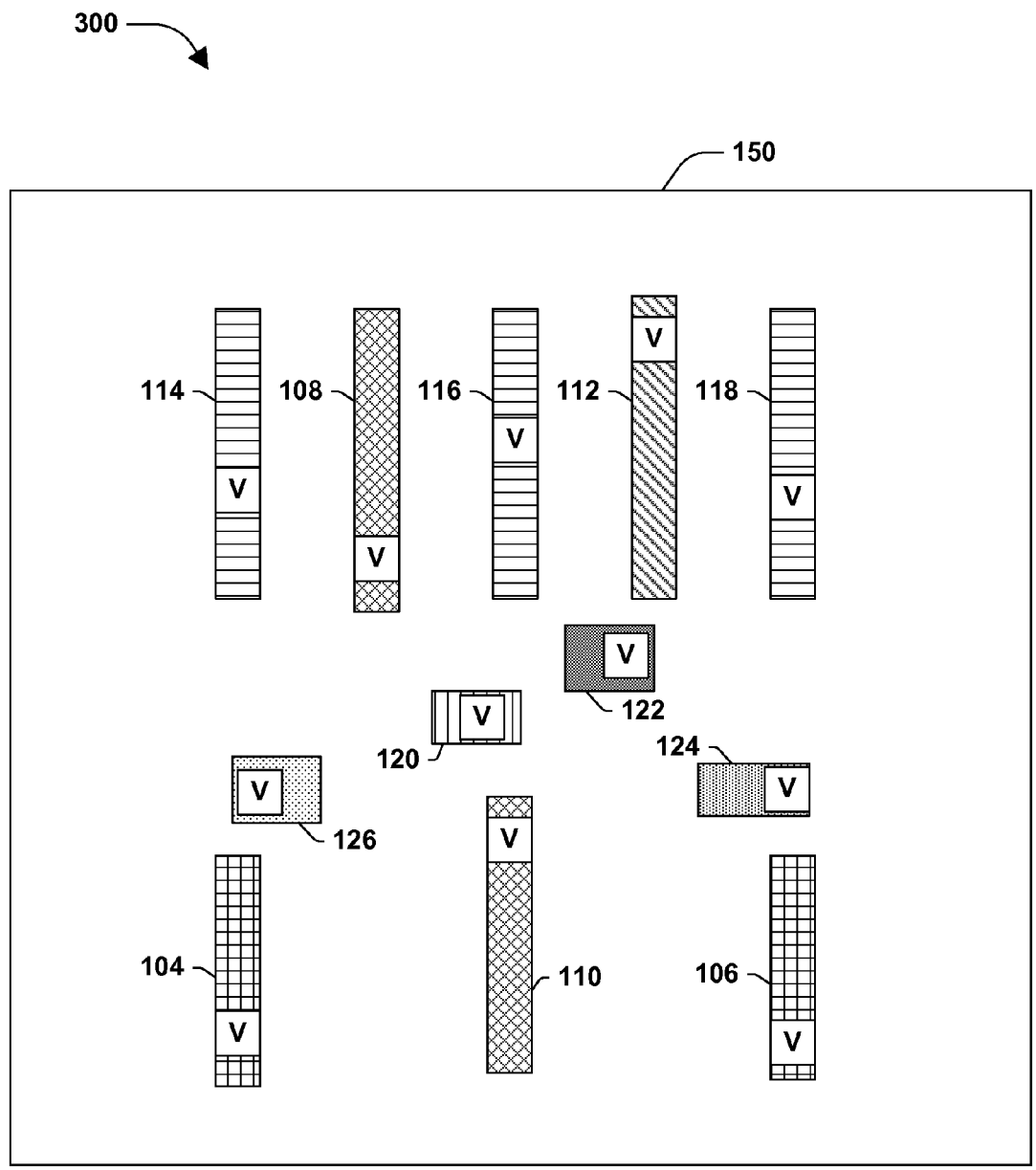
FIG. 3 is a simplified top-down view of a design layout, according to some embodiments.
Figure 4:
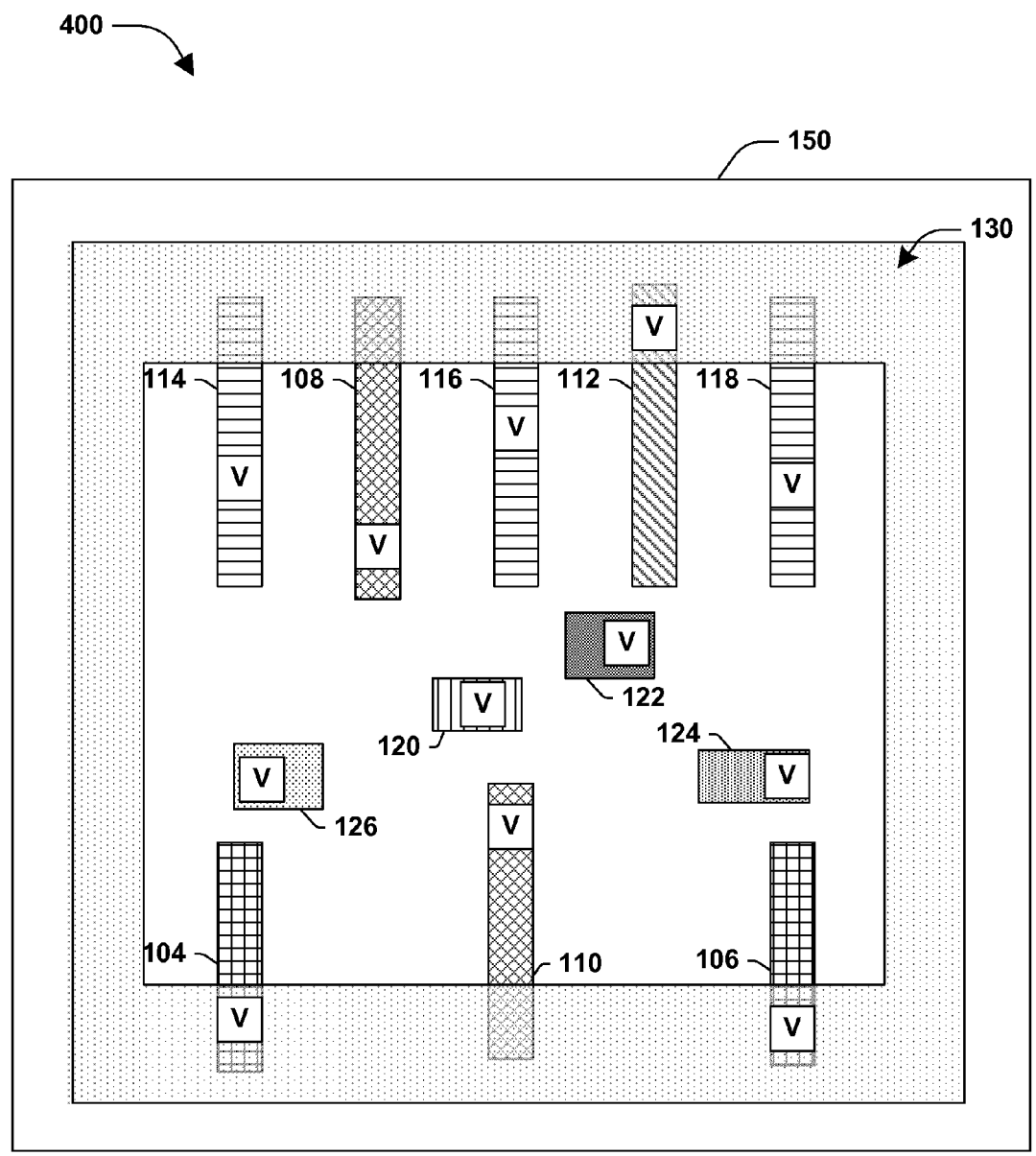
FIG. 4 is a simplified top-down view of a design layout, according to some embodiments.
Figure 5:
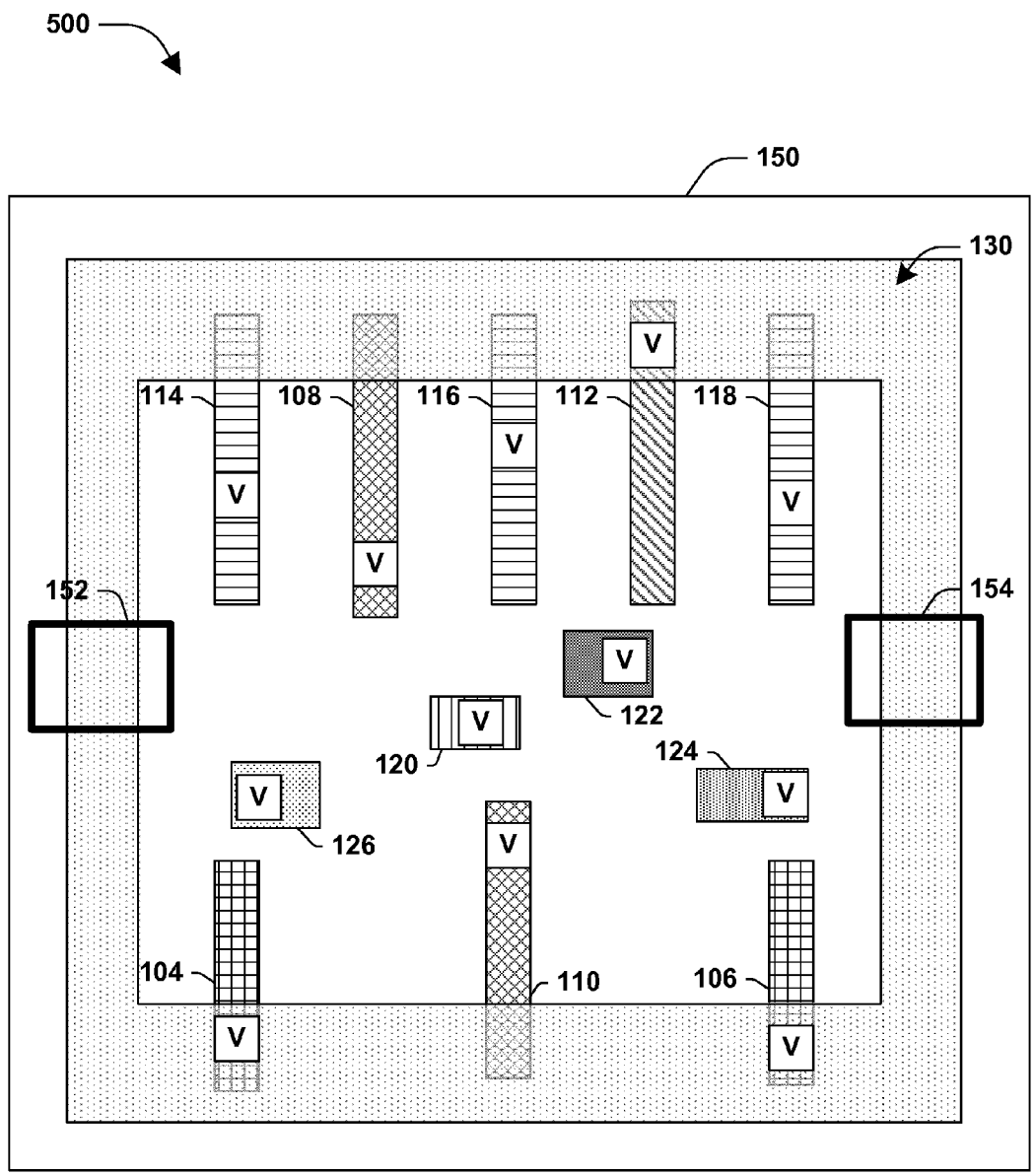
FIG. 5 is a simplified top-down view of a design layout, according to some embodiments.
Figure 6:
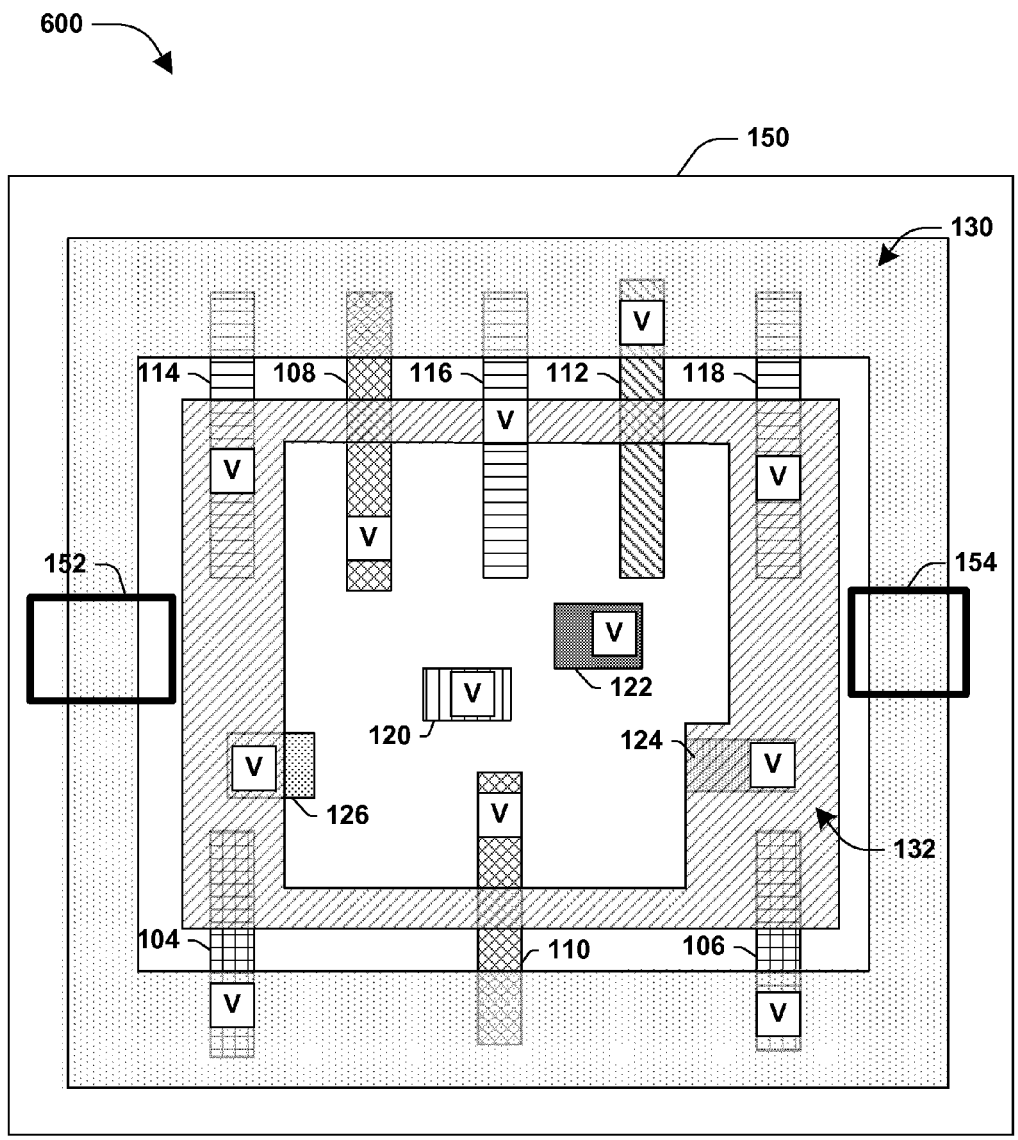
FIG. 6 is a simplified top-down view of a design layout, according to some embodiments.
Figure 7:
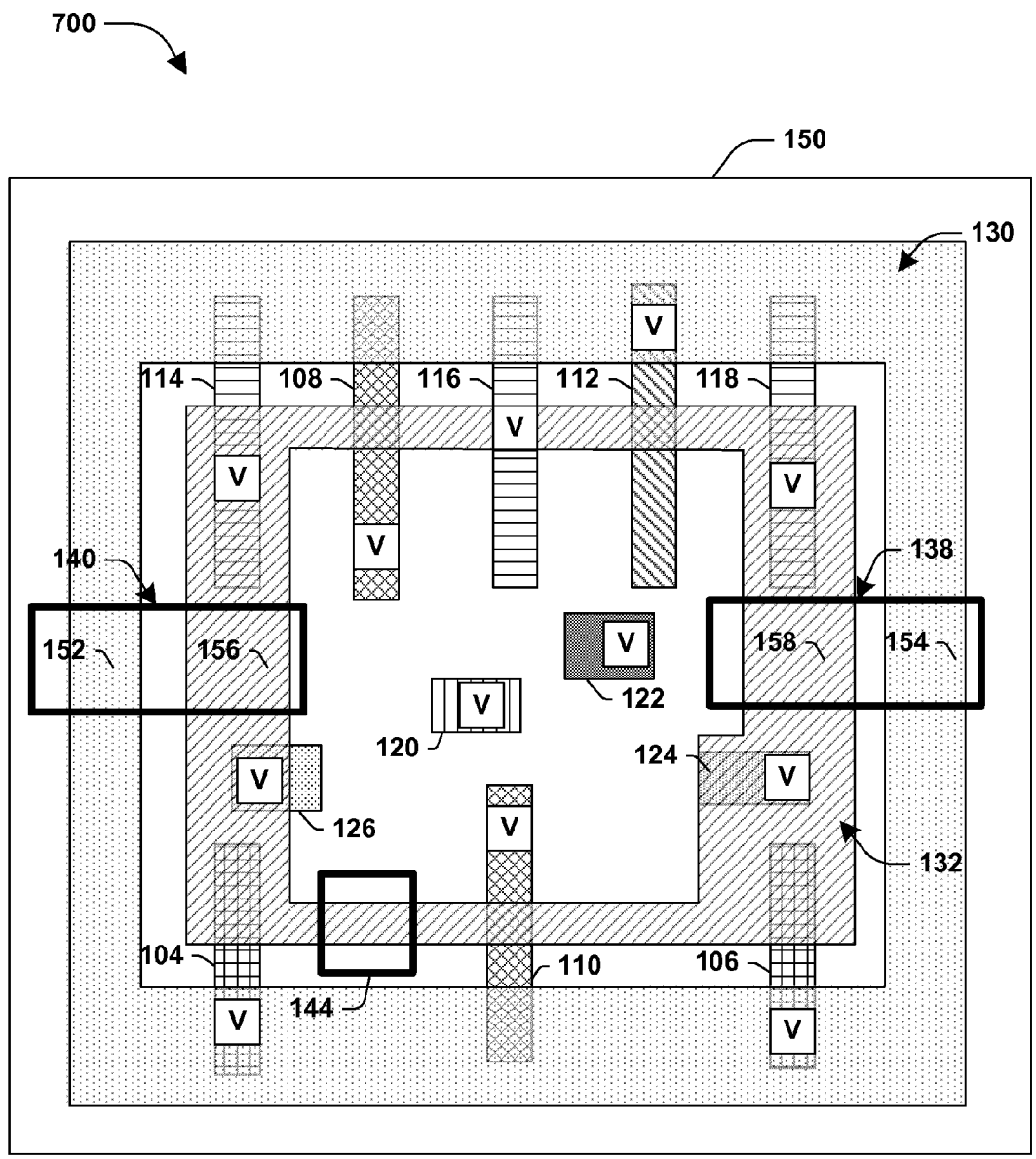
FIG. 7 is a simplified top-down view of a design layout, according to some embodiments.
Figure 8:
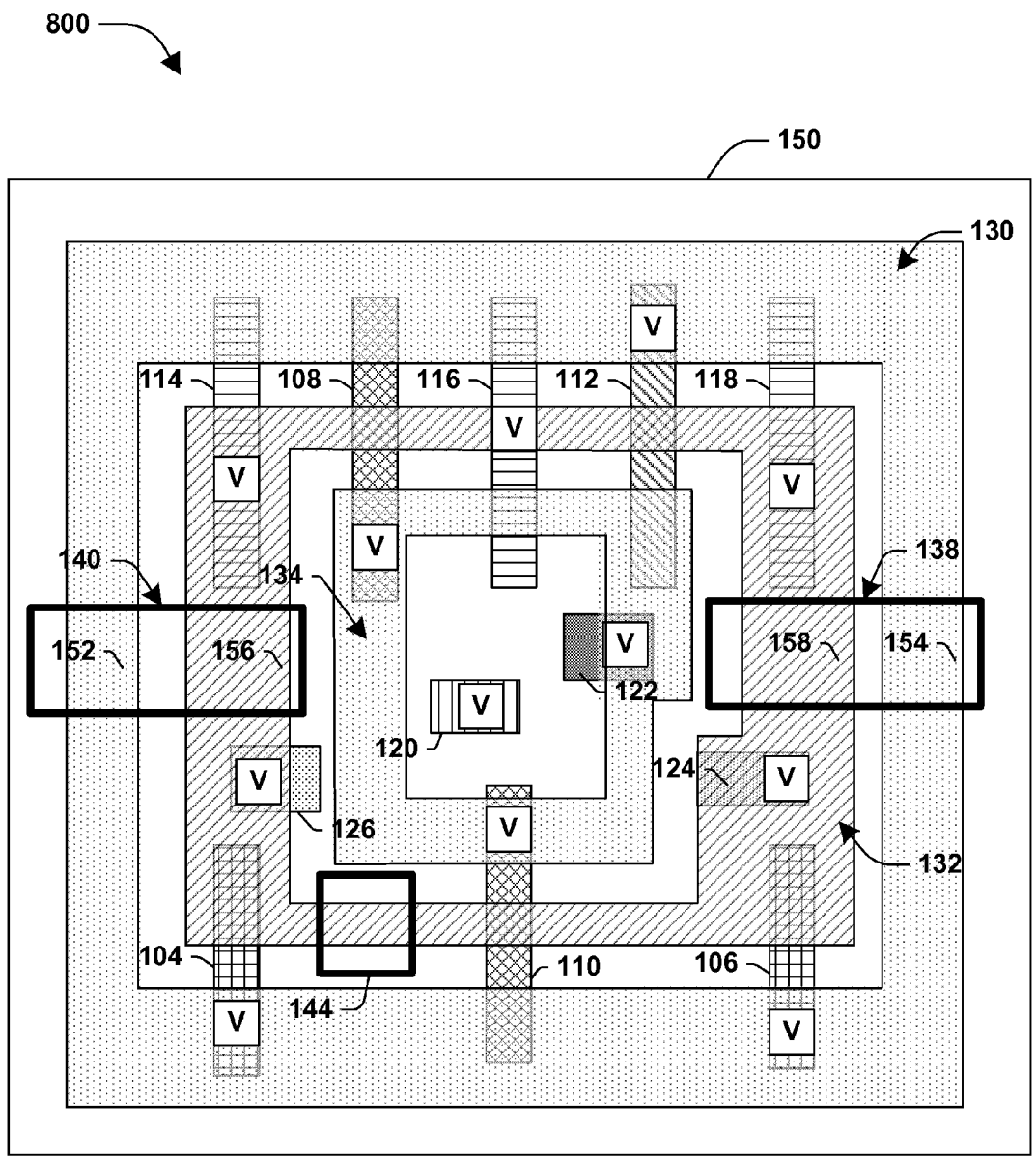
FIG. 8 is a simplified top-down view of a design layout, according to some embodiments.
Figure 9:
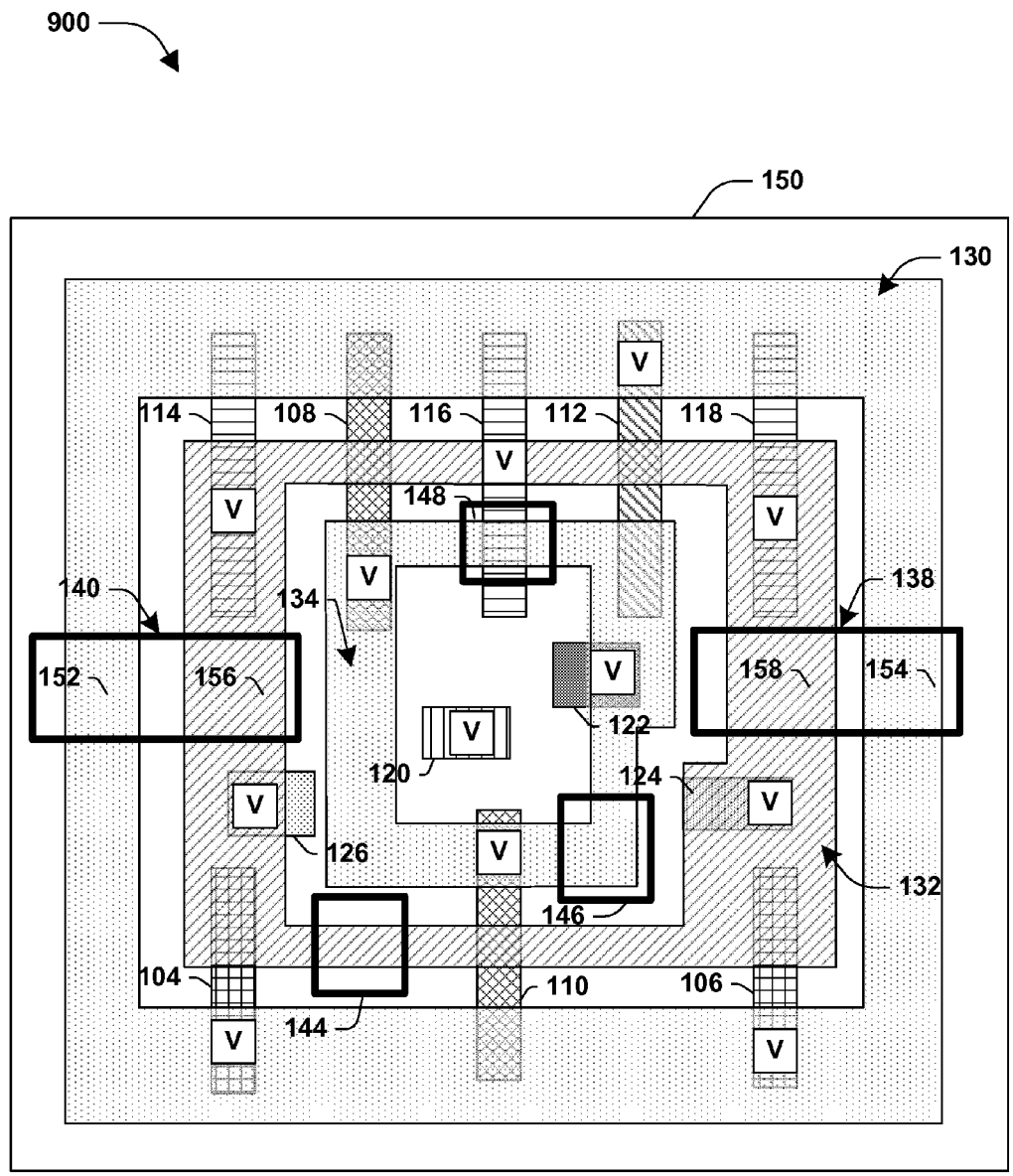
FIG. 9 is a simplified top-down view of a design layout, according to some embodiments.
Figure 10:
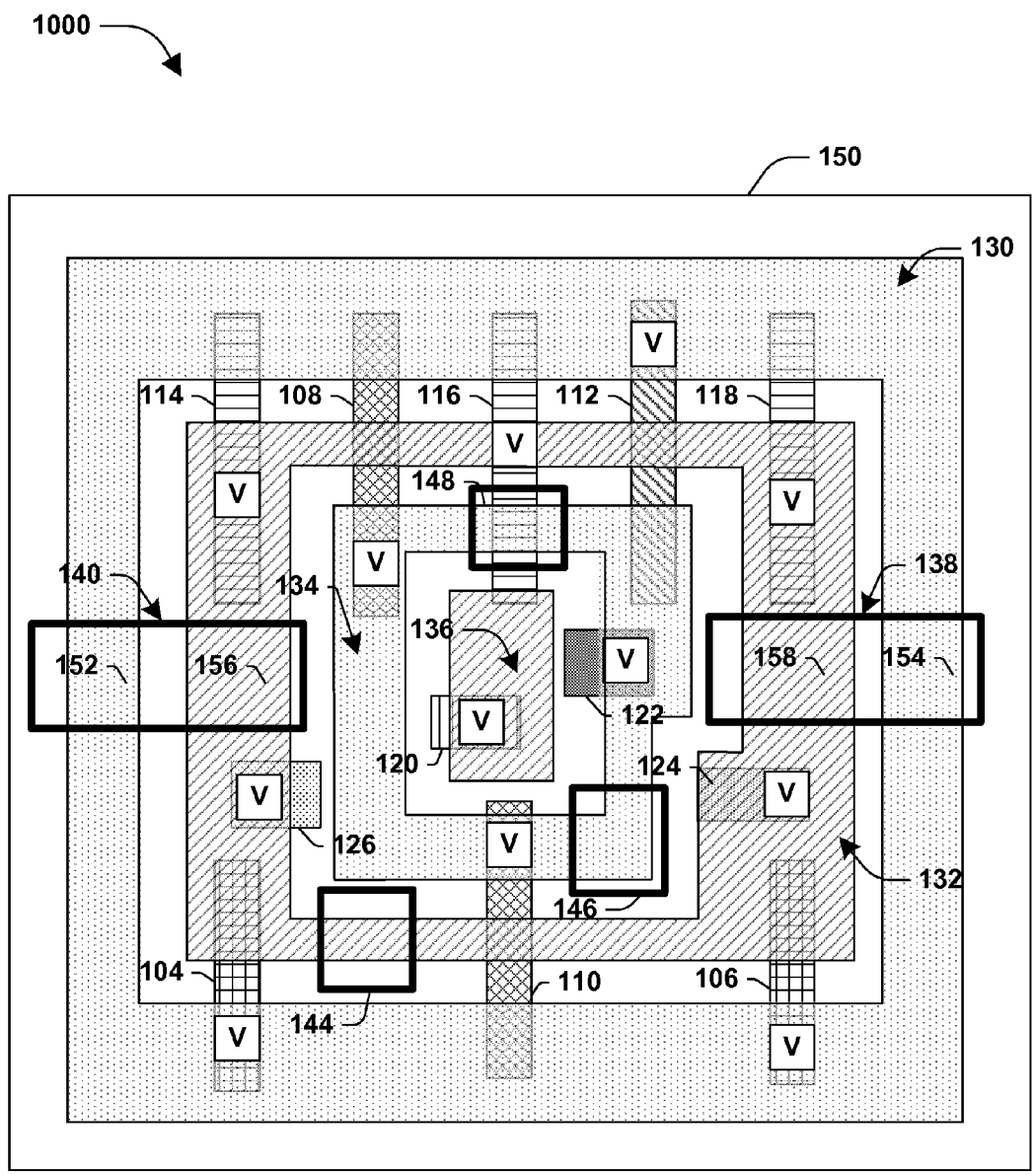
FIG. 10 is a simplified top-down view of a design layout, according to some embodiments.
Figure 11:
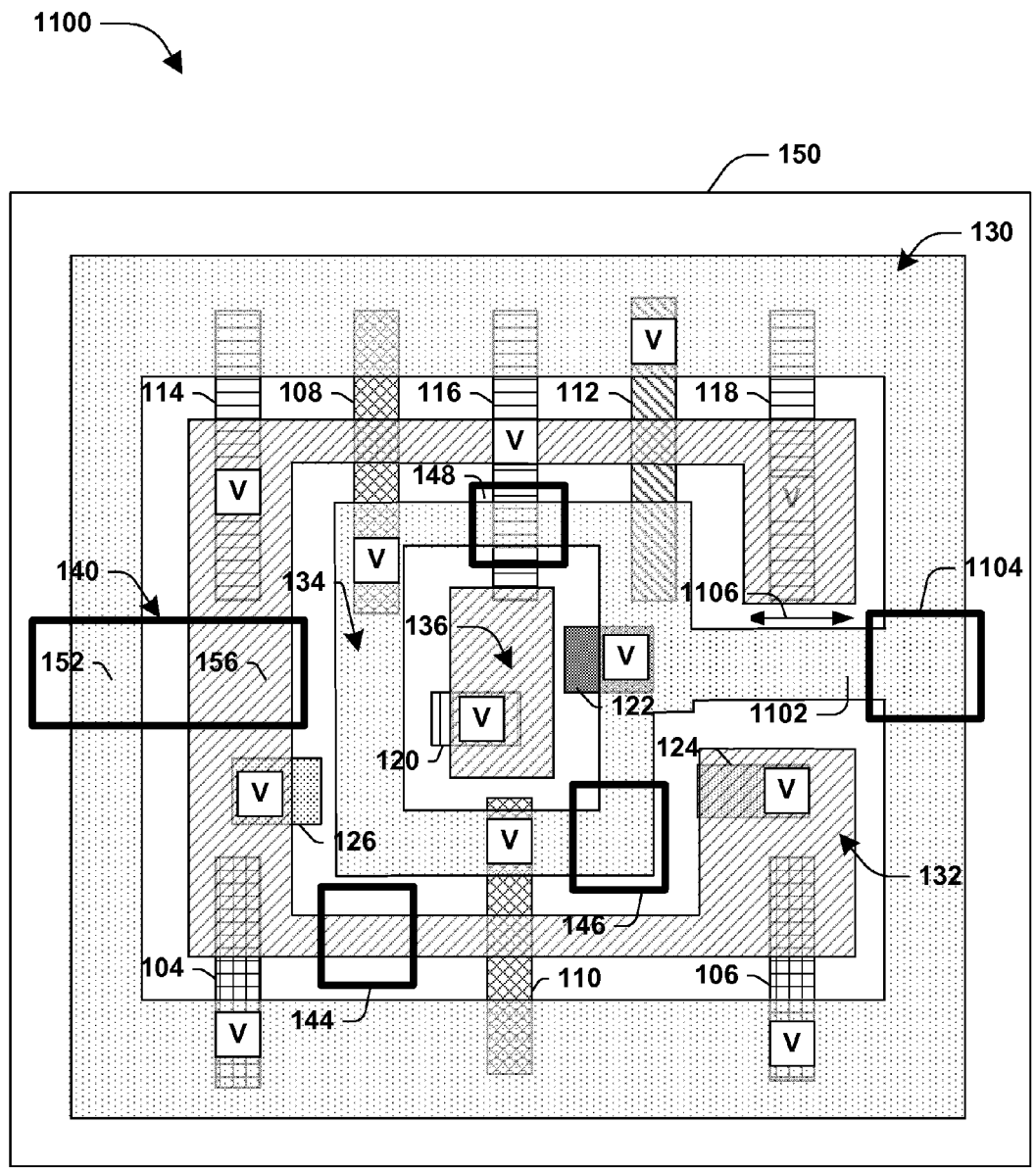
FIG. 11 is a simplified top-down view of a design layout, according to some embodiments.
Figure 12:
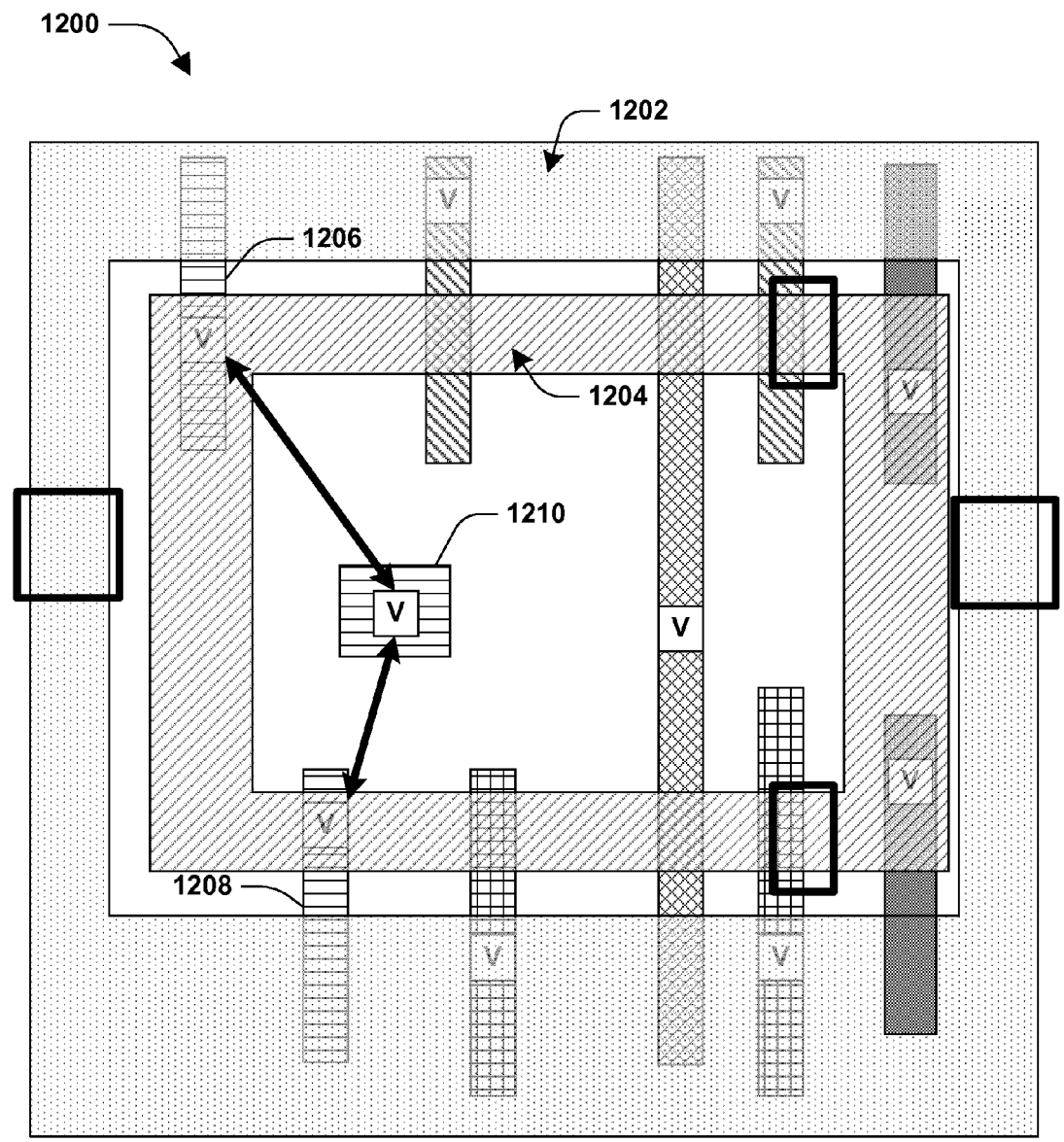
FIG. 12 is a simplified top-down view of a design layout, according to some embodiments.
Figure 13:
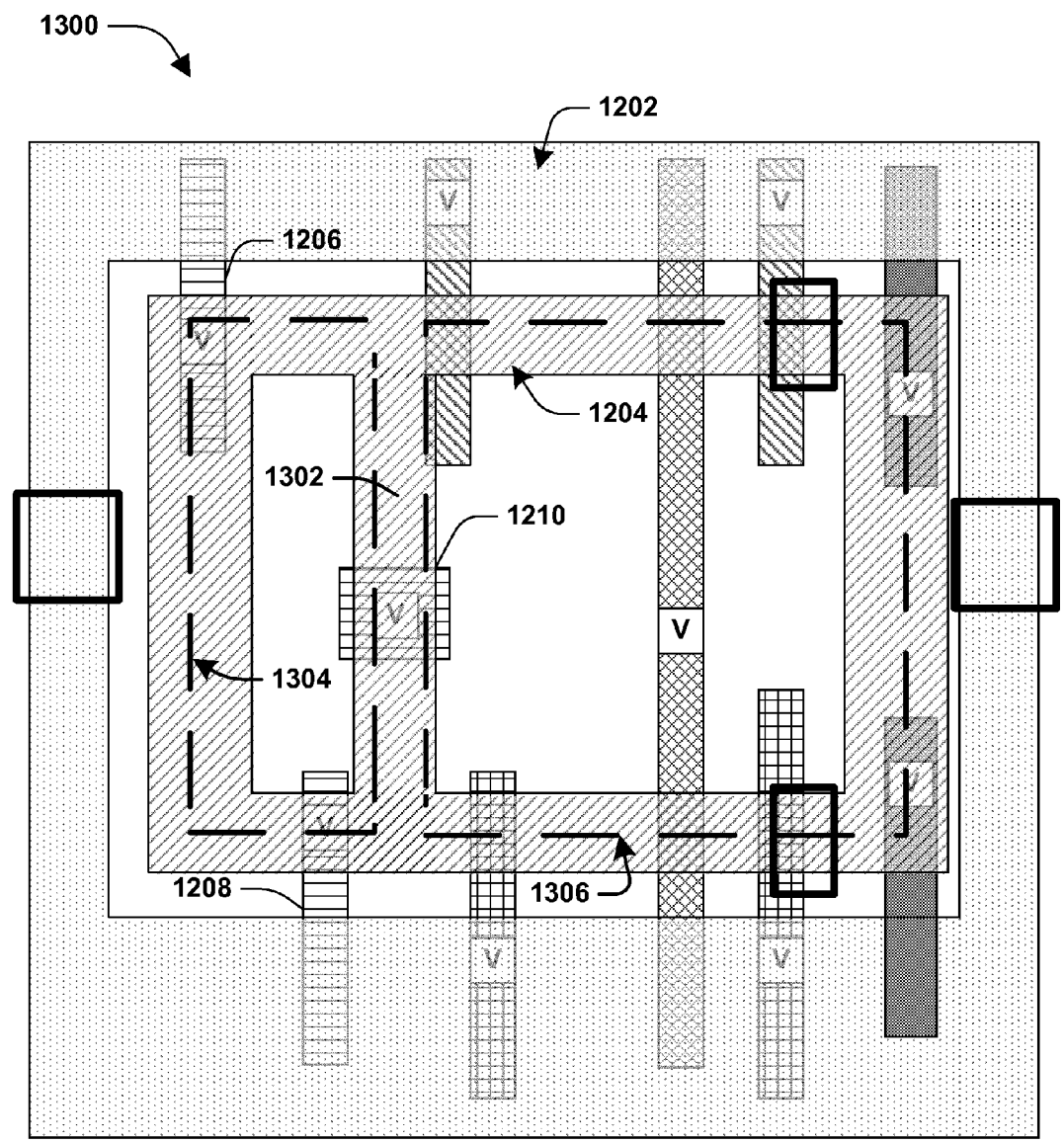
FIG. 13 is a simplified top-down view of a design layout, according to some embodiments.

An exemplary method 200 of performing design layout, according to some embodiments, is illustrated in FIG. 2, and exemplary design layouts formed by such a methodology are illustrated in FIGS. 3-13. In example 300 of FIG. 3, a design layout 150 initially comprises one or more vias, such that respective vias are restricted to a specific region. For example, the design layout 150 comprise a via (A) 104 of a first net type, a via (B) 106 of the first net type, a via (C) 108 of a second net type, a via (D) 110 of the second net type, a via (X) 112 of a third net type, a via (E) 114 of a fourth net type, a via (F) 116 of the fourth net type, a via (G) 118 of the fourth net type, a via (H) 120 of a fifth net type, a via (I) 122 of a sixth net type, a via (J) 124 of a seventh net type, and a via (K) of an eighth net type. Accordingly, one or more connectivity rings are formed (e.g., according to an onion-based design) within the design layout 150 to provide connectivity for vias, such that the design layout 150 is at least one of self-aligned double patterning (SADP) compliant or self-aligned multi patterning (SAMP) compliant.

At 202, a first connectivity ring 130 is generated within the design layout 150. In example 400 of FIG. 4, the first connectivity ring 130 is generated within the design layout 150, such that the first connectivity ring 130 connects the via (A) 104, the via (B) 106, and the via (X) 112. Because the first connectivity ring 130 provides connectivity for the via (A) 104, the via (B) 106, and the via (X) 112, such vias are referred to as ring one vias. In an example, the first connectivity ring 130 comprises a power connectivity ring that connect to a VSS via (e.g., the via (X) 112) and a VDD via (e.g., the via (A) 104, the via (B) 106, etc.). In an example, the first connectivity ring 130 is generated from a first connectivity material type, such as mandrel. In another example, the a first portion of the first connectivity ring 130 is formed from a first mandrel type, while a second portion of the first connectivity ring is formed from a second mandrel type different than the first mandrel type (e.g., an SAMP design). In an example, a first spacer, having a substantially uniform width, is generated around the first connectivity ring 130.

At 204, responsive to the first connectivity ring 130 connecting a first ring one via to a second ring one via, where the first ring one via has a net type that is different than a net type of the second ring one via, one or more cuts are applied to the first connectivity ring 130 to isolate the first ring one via from the second ring one via. In example 500 of FIG. 5, a first cut 152 and a second cut 154 are generated along the first connectivity ring 130 in order to isolate the via (X) 112, having the first net type, from the via (A) 104 and the via (B) having the second net type. In an example where the first connectivity ring 130 comprises a power connectivity ring, a power disconnect cut is applied to the power connectivity ring to isolate one or more VSS vias from one or more VDD vias.

At 206, a second connectivity ring 132 is generated within the design layout 150. In example 600 of FIG. 6, the second connectivity ring 132 is generated within the design layout 150, such that the second connectivity ring 132 connects the via (E) 114, the via (F) 116, the via (G) 118, the via (J) 124, and the via (K) 126. Because the second connectivity ring 132 provides connectivity for the via (E) 114, the via (F) 116, the via (G) 118, the via (J) 124, and the via (K) 126, such vias are referred to as ring two vias. In an example, the second connectivity ring 132 is generated from a second connectivity material type, such as a passive pattern. In an example, a second spacer, having a substantially uniform width, is generated around the second connectivity ring 132.

At 208, responsive to the second connectivity ring 132 connecting a first ring two via to a second ring two via, where the first ring two via has a net type that is different than a net type of the second ring two via, one or more cuts are applied to the second connectivity ring 132 to isolate the first ring two via from the second ring two via. In example 700 of FIG. 7, a third cut 156 and a fourth cut 158 are generated along the second connectivity ring 132 in order to isolate the via (E) 114, the via (F) 116, and the via (G) 118, having the fourth net type, from vias having other net types, such as the via (J) 124 having the seventh net type and the via (K) 126 having the eighth net type. In an example, the third cut 156 and the first cut 152 are merged to create a first merged cut 140, and the fourth cut 158 and the second cut 154 are merged to a create a second merged cut 138. A fifth cut 144 is generated along the second connectivity ring 132 in order to isolate the via (J) 124, having the seventh net type, and the via (K) 126 having the eighth net type.

In some embodiments, one or more additional connectivity rings are generated within the design layout 150. In example 800 of FIG. 8, a third connectivity ring 134 is generated within the design layout 150, such that the third connectivity ring 134 connects the via (C) 108, the via (D) 110, and the via (I) 122. Because the third connectivity ring 134 provides connectivity for the via (C) 108, the via (D) 110, and the via (I) 122, such vias are referred to as ring three vias. In an example, the third connectivity ring 134 is generated from the first connectivity material, such as mandrel. In an example, a third spacer, having a substantially uniform width, is generated around the third connectivity ring 134. In example 900 of FIG. 9, a sixth cut 146 and a seventh cut 148 are generated along the third connectivity ring 134 to isolate the via (I) 122, having the sixth net type, from the via (C) 108 and the via (D) 110 having the second net type. In example 1000 of FIG. 10, a fourth connectivity ring 136 is generated within the design layout 150. The fourth connectivity ring 136 provides connectivity for the via (H) 120. In some embodiments, one or more additional connectivity rings are generated until respective vias within the design layout are connected by at least one connectivity ring. Responsive to identifying a first via having a net type that is different than a net type of a second via that is adjacent to the first via, a cut is applied to at least one corresponding connectivity ring to isolate the first via from the second via. In this way, one or more cuts are applied so that isolation is provided between vias of different net types. In an embodiment, this is iteratively performed until no two vias of different net types are adjacent to one another without being isolated from one another.

In some embodiments, a cross-circle connector, such as a cross-ring wire, is generated to connect a connectivity ring with another connectivity ring. In example 1100 of FIG. 11, a cross-circle connector 1102 is generated between the first connectivity ring 130 and the third connectivity ring 134. In an example, the cross-circle connector 1102 is generated because the first connectivity ring 130 and the third connectivity ring 134 are both generated from the first connectivity material. In another example, the cross-circle connector 1102 is generated based upon a width 1106 of a portion of the second connectivity ring 132 exceeding a width threshold. In an example, the merged cut 138 (e.g., merged cut 138 of FIG. 10) is replaced with a new cut 1104 along the first connectivity ring 130.

In some embodiments, a ring connector, such as a sub-ring wire, is generated between a first portion of a connectivity ring and a second portion of the connectivity ring to form a first connectivity sub-ring and a second connectivity sub-ring. In example 1200 of FIG. 12, a first connectivity ring 1202 and a second connectivity ring 1204 are generated within a design layout. The first connectivity ring 1202 provides connectivity for one or more vias, such that vias of different net types are not connected together. The second connectivity ring 1204 provides connectivity for one or more vias, such as a first via 1206 and a second via 1208 having a first net type. In an example, the design layout comprises a third via 1210 having the first net type. However, the third via 1210 is not initially connected by the second connectivity ring 1204. Accordingly, connectivity is provided for the third via 1210 by way of a ring connector. In example 1300 of FIG. 13, a ring connector 1302 is generated between a first portion of the second connectivity ring 1204 and a second portion of the second connectivity ring 1204 to form a first connectivity sub-ring 1304 and a second connectivity sub-ring 1306. In an example, the ring connector 1302 is generated to connect the third via 1210, having the first net type, with at least one of the first via 1206 or the second via 1208 also having the first net type.

According to an aspect of the instant disclosure, a method for performing design layout is provided. The method comprises, generating a first connectivity ring, from a first connectivity material type, within a design layout to connect one or more ring one vias. Responsive to the first connectivity ring connecting a first ring one via to a second ring one via, where the first ring one via has a different net type than the second ring one via, a first cut to the first connectivity ring is applied to the first connectivity ring to isolate the first ring one via from the second ring one via. A second connectivity ring is generated, from a second connectivity material type, within the design layout to connect one or more ring two vias. Responsive to the second connectivity ring connecting a first ring two via to a second ring two via, where the first ring two via has a different net type than the second ring two via, a second cut is applied to the second connectivity ring to isolate the first ring two via from the second ring two via.

According to an aspect of the instant disclosure, a system for performing design layout is provided. The system comprises a design layout component. The design layout component is configured to generate a first connectivity ring, within a design layout, that connects on or more ring one vias. The first connectivity ring comprises mandrel or passive pattern. The design layout component is configured to generate a second connectivity ring, at least partially surrounded by the first connectivity ring within the design layout, which connects one or more ring two vias. The second connectivity ring comprises a passive pattern. One or more cuts are generated within the design layout to isolate vias having different net types.

According to an aspect of the instant disclosure, a self aligned patterning compliant layout is provided. The self aligned patterning compliant layout comprises one or more vias of a design layout associated with an electrical component, such as a standard cell. The self aligned patterning compliant layout comprises one or more connectivity rings that connect respective vias. In an example, a first connectivity ring comprises a first via having a first via type and a second via having a second via type. The first via is isolated from the second via based upon a first cut applied to the first connectivity ring. In this way, the self aligned patterning compliant layout comprises one or more cuts. The self aligned patterning compliant layout comprises at least one of a cross-circle connector or a ring connector. The cross-circle connector is configured to connect a second connectivity ring to a third connectivity ring based upon the second connectivity ring and the third connectivity ring being formed of a first connectivity material, such as mandrel or passive pattern. The ring connector is formed between the second connectivity ring and the third connectivity ring to form a first connectivity sub-ring and a second connectivity sub-ring.

Figure 14:
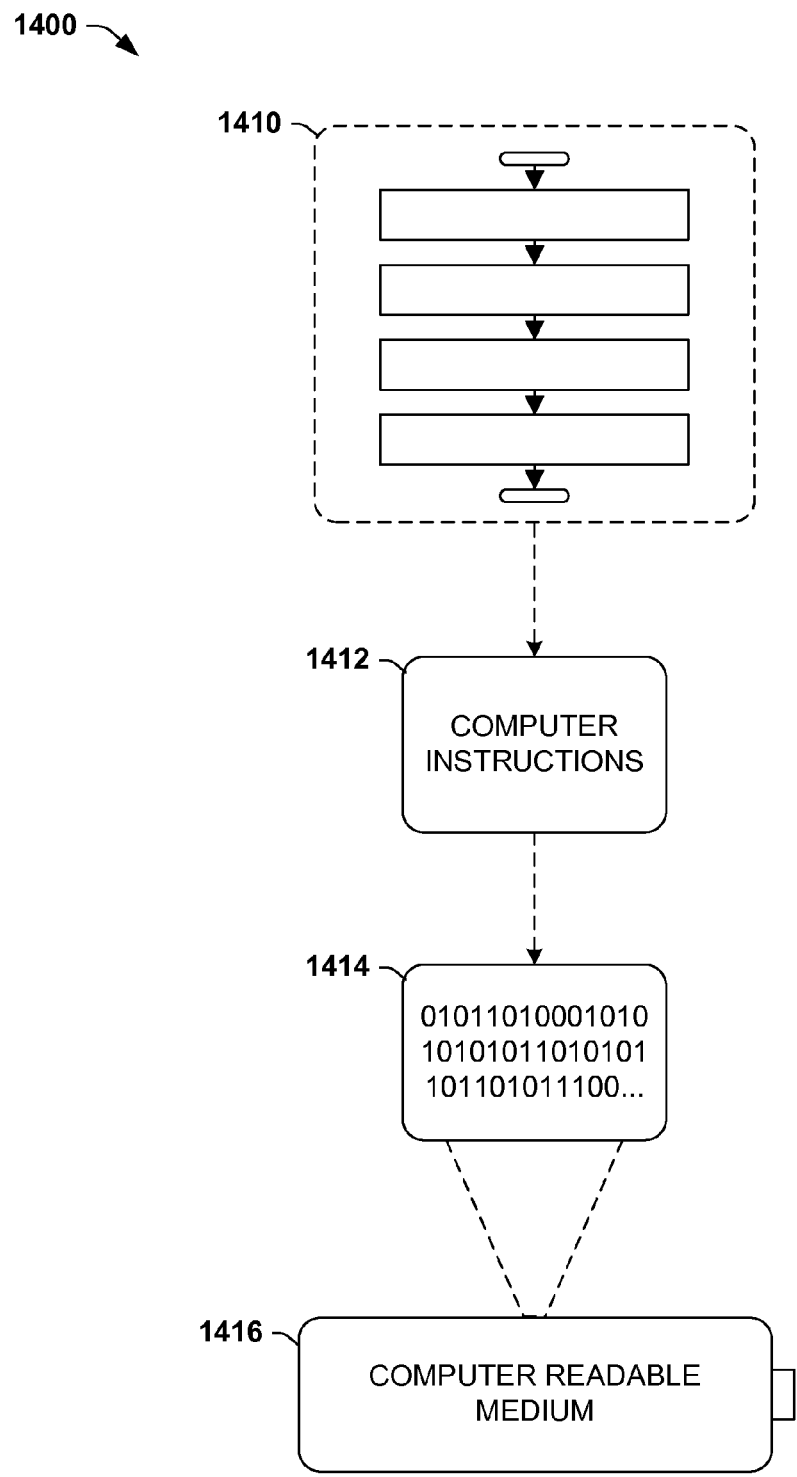
FIG. 14 is an illustration of an example computer-readable medium wherein processor-executable instructions configured to embody one or more of the provisions set forth herein may be comprised.

Still another embodiment involves a computer-readable medium comprising processor-executable instructions configured to implement one or more of the techniques presented herein. An exemplary computer-readable medium that may be devised in these ways is illustrated in FIG. 14, wherein the implementation 1400 comprises a computer-readable medium 1416 (e.g., a CD-R, DVD-R, flash drive, a platter of a hard disk drive, etc.), on which is encoded computer-readable data 1414. This computer-readable data 1414 in turn comprises a set of computer instructions 1412 configured to operate according to one or more of the principles set forth herein. In one such embodiment 1400, the processor-executable computer instructions 1412 may be configured to perform a method 1410, such as at least some of the exemplary method 200 of FIG. 2, for example. In another such embodiment, the processor-executable instructions 1412 may be configured to implement a system, such as at least some of the exemplary system 100 of FIG. 1, for example. Many such computer-readable media may be devised by those of ordinary skill in the art that are configured to operate in accordance with the techniques presented herein.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

As used in this application, the terms "component," "module," "system", "interface", and the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media.

Of course, those skilled in the art will recognize many modifications may be made to this configuration without departing from the scope or spirit of the claimed subject matter.

Figure 15:
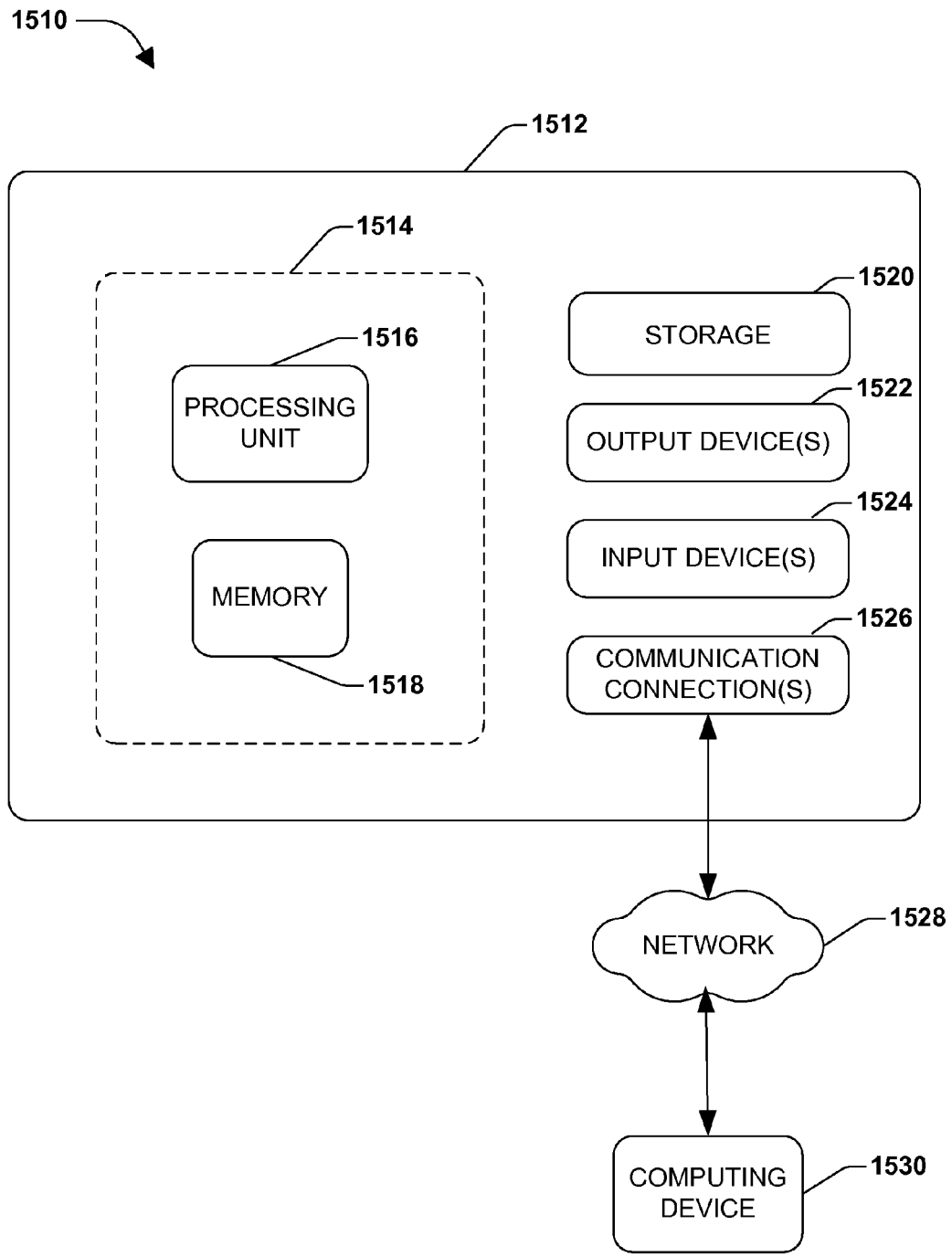
FIG. 15 illustrates an example computing environment wherein one or more of the provisions set forth herein may be implemented.

FIG. 15 and the following discussion provide a brief, general description of a suitable computing environment to implement embodiments of one or more of the provisions set forth herein. The operating environment of FIG. 15 is only one example of a suitable operating environment and is not intended to suggest any limitation as to the scope of use or functionality of the operating environment. Example computing devices include, but are not limited to, personal computers, server computers, hand-held or laptop devices, mobile devices (such as mobile phones, Personal Digital Assistants (PDAs), media players, and the like), multiprocessor systems, consumer electronics, mini computers, mainframe computers, distributed computing environments that include any of the above systems or devices, and the like.

Although not required, embodiments are described in the general context of "computer readable instructions" being executed by one or more computing devices. Computer readable instructions may be distributed via computer readable media (discussed below). Computer readable instructions may be implemented as program modules, such as functions, objects, Application Programming Interfaces (APIs), data structures, and the like, that perform particular tasks or implement particular abstract data types. Typically, the functionality of the computer readable instructions may be combined or distributed as desired in various environments.

FIG. 15 illustrates an example of a system 1510 comprising a computing device 1512 configured to implement one or more embodiments provided herein. In one configuration, computing device 1512 includes at least one processing unit 1516 and memory 1518. Depending on the exact configuration and type of computing device, memory 1518 may be volatile (such as RAM, for example), non-volatile (such as ROM, flash memory, etc., for example) or some combination of the two. This configuration is illustrated in FIG. 15 by dashed line 1514.

In other embodiments, device 1512 may include additional features and/or functionality. For example, device 1512 may also include additional storage (e.g., removable and/or non-removable) including, but not limited to, magnetic storage, optical storage, and the like. Such additional storage is illustrated in FIG. 15 by storage 1520. In some embodiments, computer readable instructions to implement one or more embodiments provided herein may be in storage 1520. Storage 1520 may also store other computer readable instructions to implement an operating system, an application program, and the like. Computer readable instructions may be loaded in memory 1518 for execution by processing unit 1516, for example.

The term "computer readable media" as used herein includes computer storage media. Computer storage media includes volatile and nonvolatile, removable and non-removable media implemented in any method or technology for storage of information such as computer readable instructions or other data. Memory 1518 and storage 1520 are examples of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by device 1512. Any such computer storage media may be part of device 1512.

The term "computer readable media" may include communication media. Communication media typically embodies computer readable instructions or other data in a "modulated data signal" such as a carrier wave or other transport mechanism and includes any information delivery media. The term "modulated data signal" may include a signal that has one or more of its characteristics set or changed in such a manner as to encode information in the signal.

Device 1512 may include input device(s) 1524 such as keyboard, mouse, pen, voice input device, touch input device, infrared cameras, video input devices, and/or any other input device. Output device(s) 1522 such as one or more displays, speakers, printers, and/or any other output device may also be included in device 1512. Input device(s) 1524 and output device(s) 1522 may be connected to device 1512 via a wired connection, wireless connection, or any combination thereof. In some embodiments, an input device or an output device from another computing device may be used as input device(s) 1524 or output device(s) 1522 for computing device 1512. Device 1512 may also include communication connection(s) 1526 to facilitate communications with one or more other devices.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used in either the detailed description or the claims, such terms are intended to be inclusive in a manner similar to "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims.

What is claimed is:

1. A method for performing design layout, comprising:
generating a first connectivity ring, from a first connectivity material type, within a design layout, the first connectivity ring connecting one or more ring one vias;
responsive to the first connectivity ring connecting a first ring one via to a second ring one via, where the first ring one via has a net type that is different than a net type of the second ring one via, applying a first cut to the first connectivity ring to isolate the first ring one via from the second ring one via;
generating a second connectivity ring, from a second connectivity material, within the design layout, the second connectivity ring comprising a second connectivity material type, the second connectivity ring connecting one or more ring two vias; and
responsive to the second connectivity ring connecting a first ring two via to a second ring two via, where the first ring two via has a net type that is different than a net type of the second ring two via, applying a second cut to the second connectivity ring to isolate the first ring two via from the second ring two via,
at least some of the method implemented at least in part via a computer.

2. The method of claim 1, the generating a first connectivity ring comprising:
forming the first connectivity ring from mandrel or passive pattern.

3. The method of claim 1, the generating a second connectivity ring comprising:
forming the second connectivity ring from the second connectivity material type that is different than the first connectivity material type associated with the first connectivity ring.

4. The method of claim 1, comprising:
generating a power connectivity ring within the design layout, the power connectivity ring connecting one or more VSS vias and one or more VDD vias; and
applying one or more power disconnect cuts to the power connectivity ring to isolate at least some of the one or more VSS vias from at least some of the one or more VDD vias.

5. The method of claim 1, comprising:
generating a third connectivity ring, from the first connectivity material type, within the design layout, the third connectivity ring connecting one or more ring three vias; and
responsive to the third connectivity ring connecting a first ring three via to a second ring three via, where the first ring three via has a net type that is different than a net type of the second ring three via, applying a third cut to the third connectivity ring to isolate the first ring three via from the second ring three via.

6. The method of claim 5, comprising:
generating a cross-circle connector to connect the first connectivity ring to the third connectivity ring.

7. The method of claim 5, comprising:
generating a cross-circle connector to connect the first connectivity ring to the third connectivity ring based upon a width of the second connectivity ring exceeding a width threshold.

8. The method of claim 1, comprising:
generating a first spacer, having a substantially uniform width, around the first connectivity ring.

9. The method of claim 1, comprising:
merging the first cut and the second cut to generate a merged cut.

10. The method of claim 1, comprising:
generating a ring connector between a first portion of the first connectivity ring and a second portion of the connectivity ring to form a first connectivity sub-ring and a second connectivity sub-ring.

11. The method of claim 10, the generating a ring connector comprising:
generating the ring connector to connect a via to the first connectivity sub-ring based upon the via corresponding to a net type of at least one ring one via connected by the first connectivity sub-ring.

12. The method of claim 11, comprising:
identifying the via based upon the via not being connected to a connectivity ring.

13. The method of claim 1, the generating a first connectivity ring comprising:
forming a first portion of the first connectivity ring from a first mandrel type; and forming a second portion of the first connectivity ring from a second mandrel type that is different than the first mandrel type.

14. The method of claim 1, comprising:
generating at least one of a self-aligned double patterning (SADP) layout or a self-aligned multiple patterning (SAMP) layout based upon the design layout.

15. The method of claim 1, comprising:
generating one or more additional connectivity rings until respective vias within the design layout are connected by at least one connectivity ring; and
responsive to identifying a first via having a net type that is different than a net type of a second via that is adjacent to the first via, applying a cut to at least one corresponding connectivity ring to isolate the first via from the second via.

16. A non-transitory computer readable medium comprising processor-executable instructions that when executed perform a method, comprising:
generating a first connectivity ring, from a first connectivity material type, within a design layout, the first connectivity ring connecting one or more ring one vias;
responsive to the first connectivity ring connecting a first ring one via to a second ring one via, where the first ring one via has a net type that is different than a net type of the second ring one via, applying a first cut to the first connectivity ring to isolate the first ring one via from the second ring one via;
generating a second connectivity ring, from a second connectivity material, within the design layout, the second connectivity ring comprising a second connectivity material type, the second connectivity ring connecting one or more ring two vias; and
responsive to the second connectivity ring connecting a first ring two via to a second ring two via, where the first ring two via has a net type that is different than a net type of the second ring two via, applying a second cut to the second connectivity ring to isolate the first ring two via from the second ring two via.

17. The non-transitory computer readable medium of claim 16, the method comprising:
generating a third connectivity ring, from the first connectivity material type, within the design layout, the third connectivity ring connecting one or more ring three vias; and
responsive to the third connectivity ring connecting a first ring three via to a second ring three via, where the first ring three via has a net type that is different than a net type of the second ring three via, applying a third cut to the third connectivity ring to isolate the first ring three via from the second ring three via.

18. The non-transitory computer readable medium of claim 17, the method comprising:
generating a cross-circle connector to connect the first connectivity ring to the third connectivity ring.

19. The non-transitory computer readable of claim 16, the method comprising:
generating a ring connector between a first portion of the first connectivity ring and a second portion of the connectivity ring to form a first connectivity sub-ring.

20. A method for performing design layout, comprising:
generating a first connectivity ring, from a first connectivity material type, within a design layout, the first connectivity ring connecting one or more ring one vias;
responsive to the first connectivity ring connecting a first ring one via to a second ring one via, where the first ring one via has a net type that is different than a net type of the second ring one via, applying a first cut to the first connectivity ring to isolate the first ring one via from the second ring one via;
generating a second connectivity ring, from a second connectivity material, within the design layout, the second connectivity ring comprising a second connectivity material type, the second connectivity ring connecting one or more ring two vias;
responsive to the second connectivity ring connecting a first ring two via to a second ring two via, where the first ring two via has a net type that is different than a net type of the second ring two via, applying a second cut to the second connectivity ring to isolate the first ring two via from the second ring two via; and
generating a power connectivity ring within the design layout,
at least some of the method implemented at least in part via a computer.

* * * * *